United States Patent [19]

Briley

[11] 3,790,823

[45] Feb. 5, 1974

[54] HIGH-SPEED TRANSISTOR DIGITAL GATING

[75] Inventor: Bruce Edwin Briley, Countryside, Ill.

[73] Assignee: Bell Telephone Laboratories, Incorporated, Murray Hill, N.J.

[22] Filed: Mar. 3, 1972

[21] Appl. No.: 231,658

[52] U.S. Cl. .............. 307/255, 307/243, 307/299 A
[51] Int. Cl. .......................................... H03k 17/00
[58] Field of Search ... 307/255, 243, 299 A; 330/21

[56] References Cited

UNITED STATES PATENTS

| | | | |
|---|---|---|---|
| 3,213,294 | 10/1965 | Okuda | 307/254 |
| 3,077,545 | 2/1963 | Rywak | 307/255 X |
| 3,290,653 | 12/1966 | Slattery et al. | 307/255 X |
| 3,694,666 | 9/1972 | Briley | 307/299 A X |

*Primary Examiner*—Rudolph V. Rolinec
*Assistant Examiner*—B. P. Davis
*Attorney, Agent, or Firm*—R. B. Ardis

[57] ABSTRACT

A transistor digital gating circuit includes an output stage containing two transistors of opposite conductivity type which are held out of saturation at all times and an input stage containing two multiple-emitter transistors of opposite conductivity type which are kept in saturation continuously. The gate affords a high degree of isolation when disabled and avoids switching speed limitations which would be encountered if transistors were switched into and out of saturation.

8 Claims, 3 Drawing Figures

FIG. 1
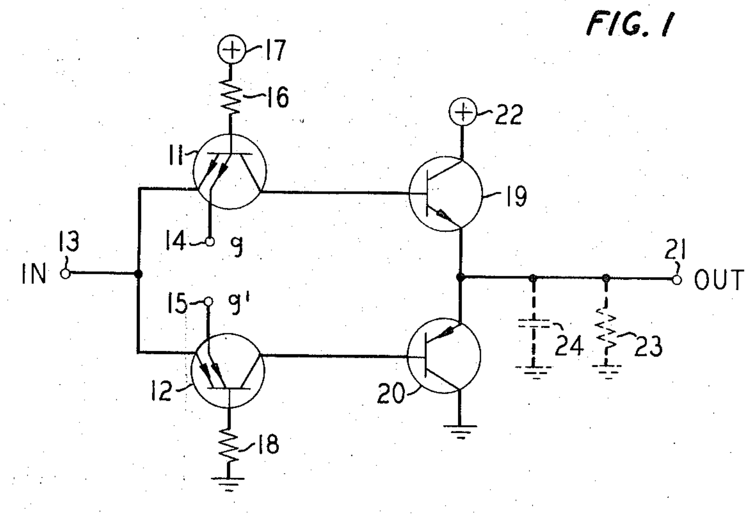
FIG. 2
| IN | g | g' | OUT |
|---|---|---|---|
| 1 | 1 | 0 | 1 |
| 0 | 1 | 0 | 0 |
| 1 | 0 | 1 | HI Z |
| 0 | 0 | 1 | HI Z |
FIG. 3
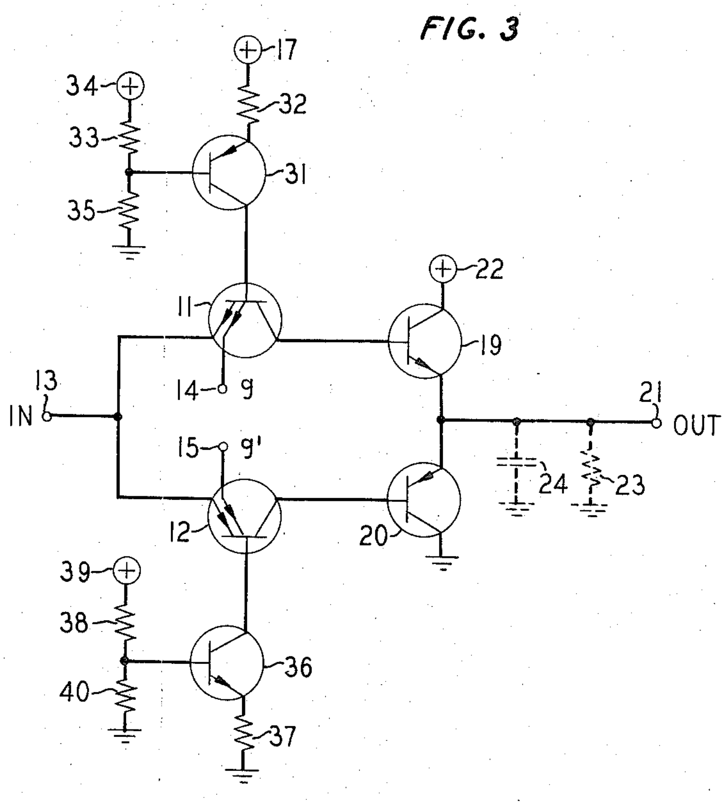

HIGH-SPEED TRANSISTOR DIGITAL GATING

BACKGROUND OF THE INVENTION

This invention relates generally to gate circuits and more particularly to transistor gate circuits of the type frequently used to couple high-speed digital signals from data registers to an output bus.

There are many existing transistor digital gate circuits, but most suffer from significant switching speed limitations either when used alone or when used in conjunction with similar gate circuits to supply a common output bus. One adverse factor is frequently the time required to switch a saturated transistor out of saturation. Many transistor digital gate circuits operate by switching transistors into and out of saturation and the delay occasioned by this time lag places a significant limitation upon switching speed. Another adverse effect is encountered when substantial numbers of gate circuits are used to feed the same output bus in parallel. Because inactive gates tend to shunt down and reduce the effective load impedance, they can have an additional adverse effect upon switching speed. The result is usually a necessary compromise between maximum attainable switching speed and the total number of gate circuits used to feed the same output bus.

SUMMARY OF THE INVENTION

The invention in its various aspects overcomes both of these limitations of the prior art. Broadly, it overcomes switching speed limitations occasioned by saturation delay by avoiding any need to switch transistors into or out of saturation. In some of its more specific aspects, the invention supplements this effect when multiple gates are used to drive a common output bus by improving the isolation of inactive gates.

In its broader aspects, the invention takes the form of a two-stage transistor gate in which the input stage remains in saturation continuously and the output stage remains out of saturation. In accordance with these aspects of the invention, a high-speed digital gate includes a pair of output transistors of opposite conductivity type having their emitter electrodes connected together and to a common output terminal and their collector electrodes connected to opposite sides of a direct voltage source poled to provide both output transistors with reverse collector current, a pair of input transistors of opposite conductivity type each having an emitter electrode connected to a common input terminal, resistive connections from the respective base electrodes of the input transistors to opposite sides of a direct voltage source poled to provide both input transistors with forward emitter and collector current, and a connection from the collector electrode of each input transistor to the base electrode of the output transistor of the same conductivity type. Digital inputs at the common input terminal operate on the input transistors by causing base current to be diverted to the collector electrode of one of them, thereby placing the collector and base electrodes of that input transistor at substantially the same potential and increasing the forward emitter-base bias on one of the output transistors. That output transistor then operates as an emitter follower and couples the collector voltage of the input transistor to the common output terminal. Both input transistors remain in saturation at all times and, because there is no significant impedance between the collector electrodes of the output transistors and their associated voltage source, a reverse bias is maintained on the collector-base junctions of both output transistors which keeps them out of saturation at all times. Switching speed limitations occasioned by saturation time delay are thereby avoided.

In some of its more specific aspects, the invention takes the form of a two-stage transistor gate which, in addition to avoiding saturation time delay, has improved isolation from other gates when not active in coupling signals to the common output bus. In accordance with these aspects of the invention, the transistors of the input stage of the gate described above are of the multiple emitter variety and, while one emitter electrode of each input transistor is connected to a common input terminal, an additional emitter electrode of each input transistor is connected to a respective gating terminal. The gate is disabled by potentials at the gating terminals providing the additional emitter electrodes of the input transistors with forward emitter current, thereby diverting current from the other emitter electrodes of the same transistors and reducing the forward emitter-base bias on the output transistors. Both output transistors then present very high impedances to the common output terminal to provide improved isolation. The gate is enabled by removing the disabling potentials at the gating terminals.

BRIEF DESCRIPTION OF THE DRAWING

FIG. 1 is a schematic diagram of one relatively simple embodiment of the invention.

FIG. 2 is a logic table illustrating the operation of the embodiment of the invention shown in FIG. 1.

FIG. 3 is a schematic diagram of a modification of the embodiment of the invention shown in FIG. 1.

DETAILED DESCRIPTION

The input stage of the digital gate circuit shown in FIG. 1 includes a pair of multiple-emitter transistors 11 and 12. As illustrated, transistor 11 is of the n-p-n type and the transistor 12 is of the p-n-p type. One emitter electrode each of transistors 11 and 12 is connected directly to the other and to a common input terminal 13. An additional emitter electrode of transistor 11 is connected to a gating terminal 14, while an additional emitter electrode of transistor 12 is similarly connected to a gating terminal 15. The base electrode of transistor 11 is connected through a resistor 16 to the positive terminal of a direct voltage source 17 and the base electrode of transistor 12 is connected through a resistor 18 to ground.

The output stage of the digital gate circuit shown in FIG. 1 is directly coupled to the input stage and includes a pair of transistors 19 and 20. As illustrated, transistor 19 is of the n-p-n type and transistor 20 is of the p-n-p type. The collector electrode of input stage transistor 11 is connected directly to the base electrode of transistor 19 and the collector electrode of input stage transistor 12 is connected directly to the base electrode of transistor 20. The emitter electrodes of transistors 19 and 20 are connected directly together and to a common output terminal 21. The collector electrode of transistor 19 is connected directly to the positive side of a direct voltage source 22 and the collector electrode of transistor 20 is returned directly to ground. The dashed line resistor 23 represents a load resistance to ground when output terminal 21 is connected to a suitable output bus, while the dashed line capacitor 24 represents the parasitic capacity to ground from the emitter electrodes of transistors 19 and 20.

Direct voltage source 17 in FIG. 1 is poled to provide both of input transistors 11 and 12 with forward emitter current and forward collector current, thus keeping both transistors saturated at all times. Direct voltage source 22, on the other hand, is poled to provide both of output transistors 19 and 20 with reverse collector current. Because the collector electrodes of transistors 19 and 20 are connected directly to the positive terminal of source 22 and ground, respectively, they are not allowed to drift in potential. The collector-base junctions of transistors 19 and 20 are thereby kept reverse-biased at all times and both transistors are kept out of saturation.

The logic table of FIG. 2 illustrates the operation of the embodiment of the invention shown in FIG. 1. Gating terminals 14 and 15 are labeled *g* and *g'*, respectively, to indicate that the binary state of one is always opposite to that of the other. Binary 1 is represented by a positive voltage approximately equal to that of voltage source 17 and binary 0 by zero voltage or ground potential.

The digital gate circuit illustrated in FIG. 1 is enabled by binary 1 at gating terminal 14 and binary 0 at gating terminal 15. Under such conditions, there is no bias on the gating emitter electrode of either of input transistors 11 and 12. In a multiple-emitter transistor, all emitter current flows in the emitter electrode which has the strongest forward bias and substantially none at all flows in the others. Thus, in the embodiment of the invention shown in FIG. 1, when the gating emitter electrodes are not forward-biased, the remaining or input emitter electrodes are free to receive all current. When binary 1 is applied to input terminal 13, the input emitter electrode of transistor 12 receives a strong forward bias, causing it to draw all emitter current. The input emitter of transistor 11 is shut off. The continuous saturation of input transistors 11 and 12 now becomes significant.

In a saturated transistor, the collector-base junction is forward-biased and the collector electrode becomes electrically indistinguishable from another emitter electrode. Thus, when the gate circuit shown in FIG. 1 is enabled as described and a binary 1 at input terminal 13 shuts off the flow of current in the input emitter electrode of transistor 11, all current from voltage source 17 is diverted to the collector electrode of transistor 11, placing the collector and base electrodes of input transistor 11 at substantially the same potential and causing the forward bias on the emitter-base junction of output transistor 19 to increase. Output transistor 19 operates as an emitter follower, the output voltage of which is determined exclusively by its base voltage, and effectively couples the collector potential of input transistor 11 to common output terminal 21. The output from the gate circuit is thus binary 1.

When binary 0 is applied to input terminal 13 of the enabled gate in FIG. 1, the input emitter electrode of transistor 11 receives the strong forward bias, causing it to draw all emitter current. The input emitter of transistor 12 is shut off and the base draws current from the collector. The increased collector current flow into transistor 12 increases the forward bias on the emitter-base junction of output transistor 20, causing transistor 20 to operate as an emitter follower and couple the collector potential of input transistor 12 to common output terminal 21. The output from the gate is thus binary 0.

As has already been pointed out, significant speed advantages over the prior art are attained by the embodiment of the invention illustrated in FIG. 1 because it does not operate by switching transistors into and out of saturation. Transistors 11 and 12 remain saturated continuously and transistors 19 and 20 are kept out of saturation at all times. The time delay encountered when switching a saturated transistor out of saturation is thereby avoided.

The gate circuit shown in FIG. 1 is disabled by binary 0 at gating terminal 14 and binary 1 at gating terminal 15. Under such conditions, there is a strong forward bias on the gating emitter electrodes of both of input transistors 11 and 12. The gating emitter electrodes divert all current from the input emitter electrodes of transistors 11 and 12 and input terminal 13 is effectively decoupled. Because substantially all current is drawn by the gating emitter electrode in each transistor, moreover, the forward collector currents remain small and the forward emitter-base biases of output transistors 19 and 20 remain small. The emitter-collector paths of output transistors 19 and 20 present large impedances between output terminal 21 and positive voltage source 22 and ground, respectively.

Because of the large impedances provided by the emitter-collector paths of output transistors 19 and 20 in the embodiment of the invention shown in FIG. 1 while the gate is disabled, the number of gate circuits of this type which can be used to couple signals to the same output bus without adversely affecting switching speed is substantially increased. Because the output impedance of the disabled gate is high, disabled gates have very little tendency to shunt down and reduce the effective common load resistance. The effect on an enabled gate circuit is that parasitic capacity 24 may be charged more rapidly than would be possible if the effective load resistance 23 were lower.

A modification of the embodiment of the invention shown in FIG. 1 which permits still further switching speed improvement is illustrated in FIG. 3. There, the emitter-collector paths of transistors are used instead of resistors 16 and 18 in series with the base electrodes of input transistors 11 and 12 to provide higher resistances. As shown, a p-n-p transistor 31 has its collector electrode connected to the base electrode of input transistor 11 and its emitter electrode connected through a voltage dropping resistor 32 to the positive terminal of direct voltage source 17. A resistor 33 is connected from the base electrode of transistor 31 to the positive terminal of a direct voltage source 34 and a resistor 35 is returned from the base electrode of transistor 31 to ground in order to provide a forward emitter-base bias for transistor 31. Similarly, an n-p-n transistor 36 has its collector electrode connected to the base electrode of input transistor 12 and its emitter electrode connected through a voltage dropping resistor 37 to ground. A resistor 38 is connected from the base electrode of transistor 36 to the positive terminal of a direct voltage source 39 and a resistor 40 is returned from the base electrode of transistor 36 to ground in order to provide a forward emitter-base bias for transistor 36.

In the modified embodiment of the invention shown in FIG. 3, transistors 31 and 36 act as a current source and sink because of the large impedances provided by their emitter-collector paths. An additional increase in switching speed is thereby afforded in comparison with the embodiment of the invention illustrated in FIG. 1.

What is claimed is:

1. A high-speed digital gate which comprises a pair of output transistors of opposite conductivity type having their emitter electrodes connected together and to a common output terminal and their collector electrodes connected to opposite sides of a direct voltage source poled to provide both of said output transistors with reverse collector current, a pair of input transistors of opposite conductivity type each having an emitter electrode connected to a common input terminal, resistive connections from the respective base electrodes of said input transistors to opposite sides of a direct voltage source poled to provide both of said input transistors with forward emitter and collector current, and means connecting the collector electrode of each of said input transistors to the base electrode of the one of said output transistors of the same conductivity type, whereby digital signals pass from said common input terminal to said common output terminal without switching any of said transistors either into or out of saturation.

2. A high-speed digital gate in accordance with claim 1 in which said output transistors have their collector electrodes connected directly to opposite sides of a direct voltage source.

3. A high-speed digital gate in accordance with claim 2 in which said output transistors have their emitter electrodes connected directly together.

4. A high-speed digital gate in accordance with claim 3 in which each of said resistive connections comprises the emitter-collector path of a transistor.

5. A high-speed digital which comprises a pair of output transistors of opposite conductivity type having their emitter electrodes connected together and to a common output terminal and their collector electrodes connected to opposite sides of a direct voltage source poled to provide both of said output transistors with reverse collector current, a pair of multiple emitter input transistors of opposite conductivity type having one emitter electrode each connected to a common input terminal and an additional emitter electrode each connected to a respective gating terminal, resistive connections from the respective base electrodes of said input transistors to opposite sides of direct voltage source poled to provide both of said input transistors with forward emitter and collector current, and means connecting the collector electrode of each of said input transistors to the base electrode of the one of said output transistors of the same conductivity type, whereby digital signals are passed from said common input terminal to said common output terminal without switching any of said transistors either into or out of saturation and said gate is disabled by potentials at said gating terminals providing said additional emitter electrodes of said input transistors with forward emitter current and enabled by potentials at said gating terminals removing said forward emitter current.

6. A high-speed digital gate in accordance with claim 5 in which said output transistors have their collector electrodes connected directly to opposite sides of a direct voltage source.

7. A high-speed digital gate in accordance with claim 6 in which said output transistors have their emitter electrodes connected directly together.

8. A high-speed digital gate in accordance with claim 7 in which each of said resistive connections comprises the emitter-collector path of a transistor.

* * * * *

UNITED STATES PATENT OFFICE
CERTIFICATE OF CORRECTION

Patent No. 3,790,823 Dated February 5, 1974

Inventor(s) Bruce E. Briley

It is certified that error appears in the above-identified patent and that said Letters Patent are hereby corrected as shown below:

Column 6, line 1 after "digital" insert --gate--.

Signed and sealed this 9th day of July 1974.

(SEAL)
Attest:

McCOY M. GIBSON, JR.
Attesting Officer

C. MARSHALL DANN
Commissioner of Patents